United States Patent
Lee et al.

(10) Patent No.: US 9,741,951 B2
(45) Date of Patent: Aug. 22, 2017

(54) SUBSTRATE FOR ORGANIC ELECTRONIC DEVICE AND METHOD FOR MANUFACTURING SAME

(71) Applicant: LG CHEM, LTD., Seoul (KR)

(72) Inventors: Jung Hyoung Lee, Daejeon (KR); Yun Hye Hahm, Daejeon (KR); Sang Jun Lee, Daejeon (KR)

(73) Assignee: LG CHEM, LTD., Seoul (KR)

( * ) Notice: Subject to any disclaimer, the term of this patent is extended or adjusted under 35 U.S.C. 154(b) by 0 days.

(21) Appl. No.: 14/909,941

(22) PCT Filed: Sep. 30, 2014

(86) PCT No.: PCT/KR2014/009219
§ 371 (c)(1),
(2) Date: Feb. 3, 2016

(87) PCT Pub. No.: WO2015/047037
PCT Pub. Date: Apr. 2, 2015

(65) Prior Publication Data
US 2016/0197292 A1    Jul. 7, 2016

(30) Foreign Application Priority Data

Sep. 30, 2013 (KR) .................. 10-2013-0116189
Sep. 30, 2014 (KR) .................. 10-2014-0131582

(51) Int. Cl.
*H01L 51/54* (2006.01)
*H01L 51/00* (2006.01)
(Continued)

(52) U.S. Cl.
CPC ............ *H01L 51/0097* (2013.01); *C08J 7/00* (2013.01); *C23C 16/30* (2013.01);
(Continued)

(58) Field of Classification Search
CPC ......... H01L 21/02488; H01L 21/02496; H01L 21/02502; H01L 51/0097; H01L 51/448; H01L 51/5253
(Continued)

(56) References Cited

U.S. PATENT DOCUMENTS

2010/0178481 A1* 7/2010 George ............... C23C 16/402
428/213
2011/0193067 A1* 8/2011 Lee .................... H01L 51/5256
257/40
(Continued)

FOREIGN PATENT DOCUMENTS

CN    101978779 A    2/2011
JP    2006-84517 A   3/2006
(Continued)

*Primary Examiner* — George Fourson, III
(74) *Attorney, Agent, or Firm* — Dentons US LLP

(57) ABSTRACT

Provided are a substrate for an organic electronic device (OED) and a use thereof. Provided is a substrate for a device having excellent durability by preventing interlayer delamination occurring due to internal stress in a structure in which an organic material and an inorganic material are mixed. In addition, provided is an OED having another required physical property such as excellent light extraction efficiency using the substrate, as well as the excellent durability.

21 Claims, 1 Drawing Sheet

(51) Int. Cl.
    *C23C 16/455*     (2006.01)
    *H01L 51/56*     (2006.01)
    *C08J 7/00*     (2006.01)
    *C23C 16/30*     (2006.01)
    *H01L 51/44*     (2006.01)
    *H01L 51/52*     (2006.01)

(52) U.S. Cl.
    CPC .. *C23C 16/45525* (2013.01); *C23C 16/45529* (2013.01); *H01L 51/5256* (2013.01); *H01L 51/5275* (2013.01); *H01L 51/56* (2013.01); *H01L 51/0034* (2013.01); *H01L 51/0094* (2013.01); *H01L 51/448* (2013.01); *H01L 51/5253* (2013.01); *H01L 51/5268* (2013.01); *H01L 2251/303* (2013.01); *H01L 2251/5338* (2013.01); *H01L 2251/55* (2013.01); *H01L 2251/558* (2013.01); *Y02E 10/549* (2013.01); *Y02P 70/521* (2015.11)

(58) Field of Classification Search
    USPC ..................................................... 257/40, 79
    See application file for complete search history.

(56) References Cited

U.S. PATENT DOCUMENTS

| | | |
|---|---|---|
| 2012/0090757 A1 | 4/2012 | Buchan et al. |
| 2013/0022811 A1 | 1/2013 | Ahn et al. |
| 2013/0040102 A1* | 2/2013 | Gleason .................. B05D 7/52 428/141 |
| 2013/0140547 A1* | 6/2013 | Lee ..................... H01L 27/3274 257/40 |
| 2013/0333835 A1* | 12/2013 | Carcia .................. C23C 16/403 156/280 |
| 2014/0183498 A1* | 7/2014 | Dhar .................... H01L 51/5253 257/40 |
| 2014/0209877 A1* | 7/2014 | Lee ..................... H01L 29/78603 257/40 |
| 2014/0234599 A1 | 8/2014 | Chung et al. |
| 2014/0339513 A1* | 11/2014 | Yim .................... H01L 51/5203 257/40 |
| 2015/0072119 A1* | 3/2015 | George ............... C23C 16/0272 428/212 |
| 2015/0076492 A1* | 3/2015 | Kubota ............... H01L 27/1225 257/43 |
| 2015/0181698 A1* | 6/2015 | Suganuma ........ H01L 27/14618 250/208.1 |
| 2016/0111684 A1* | 4/2016 | Savas .................. H01L 51/5256 257/40 |
| 2016/0155988 A1* | 6/2016 | Kuroki ............... H01L 51/0097 257/40 |
| 2016/0215394 A1* | 7/2016 | Sung .................. H01L 51/5253 |

FOREIGN PATENT DOCUMENTS

| | | |
|---|---|---|
| JP | 2007-137028 A | 6/2007 |
| JP | 2007-216504 A | 8/2007 |
| JP | 2007296691 A | 11/2007 |
| JP | 2008056967 A | 3/2008 |
| JP | 2009238507 A | 10/2009 |
| JP | 2012-214016 A | 11/2012 |
| KR | 10-2013-0031703 A | 3/2013 |
| TW | 201232359 A1 | 8/2012 |
| TW | 201232360 A1 | 8/2012 |
| TW | 201238765 A | 10/2012 |
| WO | 2009-002892 A1 | 12/2008 |
| WO | 2013042938 A2 | 3/2013 |

* cited by examiner

[Fig. 1]
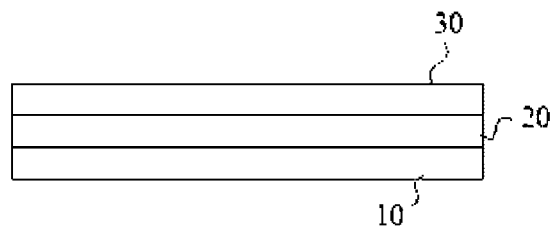
[Fig. 2]
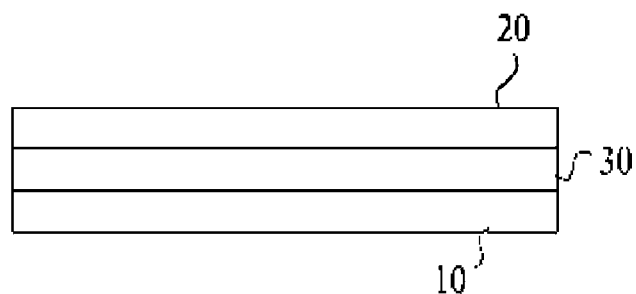
[Fig. 3]
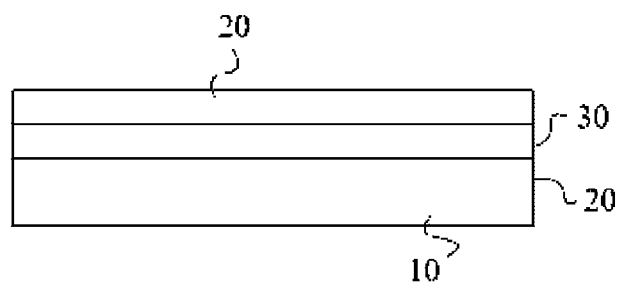

SUBSTRATE FOR ORGANIC ELECTRONIC DEVICE AND METHOD FOR MANUFACTURING SAME

CROSS-REFERENCE TO RELATED APPLICATION

This application is a National Stage Application of International Application No. PCT/KR2014/009219, filed on Sep. 30, 2014, which claims the benefit of Korean Patent Application No. 10-2013-0116189, filed on Sep. 30, 2013 and Korean Patent Application No. 10-2014-0131582, filed on Sep. 30, 2014, all of which are hereby incorporated by reference in their entirety for all purposes as if fully set forth herein.

BACKGROUND

1. Field of the Invention

The present application relates to a substrate for an organic electronic device (OED), a method of manufacturing the same, and a use thereof.

2. Discussion of Related Art

An OED is a device including at least one of layers of, for example, an organic material, which can conduct a current. Types of the OED include an organic light emitting device (OLED), an organic photovoltaic cell, an organic photo conductor (OPC), or an organic transistor.

Conventionally, the OLED, which is a representative of the OED, sequentially includes a substrate, a first electrode layer, an organic layer, and a second electrode layer. The OLED may be classified as a top emission device, a bottom emission device, and a both-side emission device. In a structure, which is called as a bottom emission device, a first electrode layer may be formed as a transparent electrode layer, and a second electrode layer may be formed as a reflective electrode layer, in a structure, which is called as a top emission device, a first electrode layer may be formed as a reflective electrode layer, and a second electrode layer may be formed as a transparent electrode layer, and in a structure which is called as a both-side emission device, both of a first electrode layer and a second electrode layer may be transparent electrode layers. Electrons and holes injected by the electrode layers may be recombined in an emitting layer present in an organic layer, thereby generating light.

Recently, the increasing attention to a flexible OLED causes an increase in demand for technology of substituting a glass substrate with a plastic substrate in a structure of the OLED.

However, the plastic substrate is vulnerable to permeation of water and oxygen. Particularly, when a display device including an OLED using the plastic substrate is manufactured, the water and oxygen are permeated from the substrate, resulting in reducing a lifespan of the OLED.

Conventionally, to prevent the permeation of the water and oxygen to the plastic substrate, a single inorganic barrier layer was formed on a surface of the plastic substrate, or a structure in which an inorganic metal layer and an organic layer are stacked or a structure in which a plurality of inorganic barrier layers are stacked by means of a pressure-sensitive adhesive layer was used. However, despite such a structure, an adhesive strength between the barrier layer and the plastic substrate was decreased due to partial crystallization of the barrier layer, or a water vapor transmission rate (WVTR) required by an OLED display was not satisfied due to permeation of water.

In addition, because of such a structure of the inorganic barrier layer, for example, in the structure called as a bottom emission device, the first electrode layer, which is used as a transparent electrode layer, was affected by a stress generated by the underlying inorganic barrier layer, resulting in film separation or generation of a crack.

REFERENCES

Reference 1: U.S. Pat. No. 6,226,890
Reference 2: U.S. Pat. No. 6,808,828
Reference 3: Japanese Patent Laid-Open No. 2000-145627
Reference 4: Japanese Patent Laid-Open No. 2001-252505

SUMMARY OF THE INVENTION

In a structure in which an organic material layer and an inorganic material layer are present together, interlayer delamination easily occurs due to a stress generated as described above, resulting in a bad influence on durability of an OED. Therefore, the present application is directed to providing a substrate for an OED which does not cause the above-described problem. Also, the present application is directed to providing an OED having excellent required physical properties such as high durability and high light extraction efficiency, which is manufactured using the substrate for an OED.

An exemplary substrate for an OED may include a flexible base film, an inorganic material layer, and an elastic layer. Here, the inorganic material layer may be formed on the base film. In this case, the elastic layer may be formed on or under the inorganic material layer, or in the inorganic material layer. FIG. 1 shows a structure in which an inorganic material layer 20 and an elastic layer 30 are sequentially formed on a base film 10, FIG. 2 shows a structure in which an elastic layer 30 is formed between a base film 10 and an inorganic material layer 20, and FIG. 3 shows a structure in which an elastic layer 30 is formed in an inorganic material layer 20. The substrate may have a combination of the structures shown in FIGS. 1 to 3. For example, the elastic layer may be formed at two or more positions, such as on, under, or in the inorganic material layer. In addition, the elastic layer and the inorganic material layer may be repeatedly formed on the substrate.

When needed, the inorganic material layer is formed in a multilayer structure including at least two thin layers, and thus crystallinity during the forming process is inhibited. Therefore, the inorganic material layer may have an excellent physical property, for example, a barrier property. In addition, the inorganic material layer may also have high refractive index, which is a physical property that the inorganic material layer having a barrier property obtained by employing the multilayer structure is difficult to have.

A type of the flexible base film applied to the substrate of the present application is not particularly limited. For example, as the base film, a flexible layer which is known to be conventionally used in realization of a flexible device in the art and has an elastic modulus of, for example, 0.05 to 5,000 or 0.5 to 2,500 MPa may be used.

As a representative example of the base film, a polymer film is used. The polymer film may be, but is not limited to, a film including triacetylcellulose, ethylenevinylalcohol, polyvinylidene chloride, polyacrylonitrile, polyethyleneterephthalate, polyethylenenaphthalate, poly(amic acid), polyarylate, polycarbonate, polymethacrylate, a cyclic olefin copolymer, polystyrene, polyethersulfone, polyimide, polynorbornene, polyamide, or polysulfone.

As the base film, one to which a functional group capable of reacting with the inorganic material layer is introduced may be used to improve interface cohesion with the inorganic material layer. For example, a functional group such as a hydroxyl group, an amino group, or a carboxyl group may chemically react with an inorganic material layer formed by an ALD method which will be described below, thereby ensuring excellent cohesion as described above. A method of introducing the above-described functional group to the base film is not particularly limited, and for example, when a polymer forming the base film includes the above-described functional group, does not include the functional group, or includes the functional group only at a small amount, the functional group may be introduced by treating a surface of the base film with corona discharging or plasma treatment. To obtain suitable interface cohesion, a ratio of introducing the functional group may be controlled.

As the base film, a light-transmitting film may be used. As an example, when the substrate for an OED is applied to a bottom emission device, a light-transmitting base film, for example, a polymer film having a transmissivity with respect to light in a visible region of 50, 60, or 70% or more may be used. Meanwhile, when the substrate for an OED is applied to a top emission device, the base film is not necessarily a light-transmitting film, and when needed, a reflective layer may be formed on a surface of the base film A using a reflective material such as aluminum. The base film may be a thin film transistor (TFT) base film having a driving TFT.

When the substrate is applied to a bottom emission device, the substrate having a haze may be used. When the substrate has a haze, the haze of the base film may be in a range of 3 to 90%. Another lower limit of the haze may be, for example, approximately 85, 80, 75, 70, 65, 60, 55, 45, 40, 35, or 30%. That is, the substrate of the present application may have a haze of 3 to 30%.

A method of providing a haze to the base film is not particularly limited, and a conventionally applied method to generate a haze may be applied. For example, when the base film is a polymer film, a method of adding scattering particles having a different refractive index from that of a peripheral polymer matrix and a suitable average particle diameter, or a method of polymerizing a monomer which can generate a haze to a polymer, for example, a monomer exhibiting a refractive index within a different range from the main chain of the polymer and forming a film using such a polymer may be applied.

The base film may have a coefficient of thermal expansion (CTE) of approximately 5 to 70 ppm/° C. Such a range may be advantageous to prevent a fault of interlayer delamination which can occur in a structure in which an organic material layer and an inorganic material layer are present together.

The base film may have a glass transition temperature of approximately 200° C. or more. Such a glass transition temperature may be a glass transition temperature of the base film itself, or a glass transition temperature of the base film having a buffer layer which will be described below. Such a range may be suitable for a high temperature process for deposition or patterning in a process of manufacturing an OED. The glass transition temperature may be, in another example, approximately 210, 220, 230, 240, or 250° C. or more. The upper limit of the glass transition temperature may be, but is not particularly limited to, for example, approximately 400, 350, or 300° C.

A surface roughness (RMS, root mean square) of the base film may be controlled within a range of 0.1 to 5 nm. The surface roughness may be that of the base film itself, or that of a surface of a buffer layer, which will be described below and formed on the base film. Such a surface roughness range may be advantageous to improve performance of a layer to be formed on the base film. For example, when an inorganic material layer is formed to have a barrier property, if the inorganic material layer is formed on a surface having the above surface roughness range, the inorganic material layer may have more excellent water preventability. In another example, the surface roughness may be approximately 4, 3, 2.5, or 2 nm or less.

The base film may have a refractive index of approximately 1.5, 1.6, 1.7, 1.75, or 1.8 or more. The term "refractive index" used herein is, unless particularly defined otherwise, a refractive index measured from light having a wavelength of approximately 550 nm. In the OLED, the range of the refractive index of the base film may be advantageous to increase light efficiency of the device. The upper limit of the refractive index of the base film may be, but is not particularly limited to, for example, approximately 2.0.

Such a high refractive index of the base film may be achieved by manufacturing the base film using a polymer having a high refractive index, or by blending a component having a high refractive index in the film in the process of manufacturing the base film.

A thickness of the base film is not particularly limited, and may be selected in a suitable range in consideration of desired performance, for example, flexibility, light extraction efficiency, or a barrier property. For example, the thickness of the base film may be approximately 10 to 50 or 20 to 30 μm.

An inorganic material layer is present on the base film. The term "inorganic material layer" used herein may be, for example, a layer including 50 or 60% or more of an inorganic material based on a weight. The inorganic material layer may include only an inorganic material or a different component such as an organic material as long as an inorganic material is included within the above range.

The inorganic material layer may be, for example, a barrier layer. The term "barrier layer" used herein may be a layer which can prevent, inhibit, or reduce permeation of external factors, for example, water or vapor, which can give a bad influence on the performance of the device such as an organic material layer. For example, the barrier layer may be a layer having a WVTR of $10^{-6}$ to $10^{-3}$ g/m²/day. The term "WVTR" used herein may be a value measured using a measurer (for example, PERMATRAN-W3/W31, MOCON, Inc.) at 40° C. and a relative humidity of 90%.

The barrier layer may be formed of a material known to reduce, prevent, or inhibit the permeation of external factors such as water and oxygen. Such a material may include a metal such as In, Sn, Pb, Au, Cu, Ag, Zr, Hf, Zn, Al, Si, La, Ti, or Ni; an oxide of the metal; a nitride of the metal; an oxynitride of the metal; a fluoride of the metal; an water-absorbing material having an absorbance of 1% or more; or a moisture-proof material having an absorption coefficient of 0.1% or less.

When the inorganic material layer is formed by a general deposition method, there is a high probability of performing crystallization, which is a property of the material, and a desired WVTR may not be obtained due to partial crystallization of the inorganic material layer. However, as any one of a method of forming an inorganic material layer which will be formed below using an oxide layer such as a metal oxide, a method of forming a thin layer multiple times, a method of controlling adjacent sub layers to have different materials during the repeated formation, and a method of forming each sub layer of a different material, which however is an oxide layer such as a metal oxide, is employed, the crystallization of the inorganic material layer may be prevented, and a desired WVTR required by a product including the substrate for an OED may be achieved.

It is suitable that the inorganic material layer has the smallest difference in a refractive index from that of the base film. In such a case, particularly, it may contribute to the formation of a substrate having excellent light extraction efficiency. For example, the absolute value of the difference in refractive index between the inorganic material layer and the base film may be approximately 1, 0.7, 0.5, or 0.3 or less. Accordingly, when the base film has a high refractive index as described above, the refractive index should be obtained in an equivalent level to that of the inorganic material layer. For example, the refractive index of the inorganic material layer may be approximately 1.8, 1.85, 1.9, or 2.0 or more. In the present application, when an OED to which the substrate is applied is an OLED, a range of the refractive index of the base film may be advantageous to increase light efficiency of the device. The upper limit of the refractive index of the inorganic material layer may be, but is not particularly limited to, for example, approximately 2.2. That is, the refractive index of the inorganic material layer of the present application may be 1.8 to 2.2.

A thickness of the inorganic material layer may be determined according to an effect according to a desired use, and a range of the thickness may be, but is not particularly limited to, in one example, approximately 10 to 100, 10 to 90, 10 to 80, 10 to 70, 10 to 60, 10 to 50, or 20 to 50 nm.

The inorganic material layer may have a monolayer or multilayer structure, but should be a multilayer structure to satisfy a crystallization degree as described above. The multilayer structure may include a structure in which the same type or different types of inorganic material layers are stacked. Formation of the inorganic material layer in a multilayer structure may contribute to the formation of an inorganic material layer having the above-described interface cohesion and the above-described crystallization degree. In addition, the formation of the inorganic material layer in a multilayer structure may contribute to the formation of the inorganic material layer having the above-described refractive index.

When the inorganic material layer is formed in a multilayer structure, a structure in which at least a first sub layer and a second sub layer are stacked may be included. In consideration of the interface cohesion, crystallization degree, barrier property, and refractive index required by the inorganic material layer, thicknesses of the first and second sub layers may be controlled. For example, the thicknesses of the first and second sub layers may be controlled within a range of 7, 6, 5, 4, 3, or 2 nm or less. The lower limit of the thickness of the sub layer is not particularly limited. The smaller the thickness of the sub layer, the higher the contribution to the control of the interface cohesion, crystallization degree, barrier property, and refractive index. However, the smaller the thickness of the sub layer, the higher the number of a process required to reach the desired thickness. Accordingly, the lower limit of the thickness of the sub layer may be set within a suitable range in consideration of the desired thickness, and may be controlled within a range of, for example, approximately 0.1 nm or more.

In consideration of the interface cohesion, crystallization degree, barrier property, and refractive index, the thicknesses of all of the sub layers included in the inorganic material layer having a multilayer structure may be controlled in the above range. In this case, the inorganic material layer may not include a sub layer having a thickness of 10, 9, or 8 nm, and preferably, more than 7 nm.

The number of sub layers included in the inorganic material layer is not particularly limited. The number of sub layers may be determined according to the thickness of the sub layer and the desired thickness of the inorganic material layer. In one example, the inorganic material layer may include 2 to 50 sub layers. In this range, the inorganic material layer may include 4, 6, 8, or 10 sub layers or more. In addition, in the above range, the inorganic material layer may include 45, 40, 35, 30, 25, 20, or 15 sub layers or less. When the inorganic material layer includes 3 sub layers or more, all of the sub layers may be the first and second sub layers, and additionally, a third sub layer or a higher sub layer may also be included.

The sub layer may be formed of various materials, but to contribute to the interface cohesion, crystallization degree, barrier property, and refractive index, may be formed of the above-described material for forming the inorganic material layer, for example, a metal such as In, Sn, Pb, Au, Cu, Ag, Zr, Hf, Zn, Al, Si, La, Ti, or Ni; an oxide of the metal; a nitride of the metal; an oxynitride of the metal; or a fluoride of the metal. Accordingly, the first and second sub layers may be an oxide layer, a nitride layer, or an oxynitride layer. When needed, all of the sub layers included in the inorganic material layer may be formed of the oxide. In this case, the type of the oxide is not particularly limited, and may be suitably selected from the above-described oxides capable of forming the barrier layer. Among the sub layers, those in contact with each other may contribute to the interface cohesion, crystallization degree, barrier property, and refractive index as long as these are formed of different materials. Accordingly, when the first and second sub layers are in contact with each other, they may be formed of different materials, for example, different oxides, nitrides, or oxynitrides. Even when the inorganic material layer includes a third sub layer, a fourth sub layer, or a higher sub layer as described above, the sub layers in contact with each other may also be formed of different materials, for example, different oxides.

The first sub layer may have a first refractive index, and the second sub layer may have a second refractive index different from the first refractive index. When such a layer is stacked, it may be advantageous to ensure the above-described effect and control the refractive index of the inorganic material layer within the above-described range. The absolute value of the difference between the first and second refractive indexes may be, for example, 0.1 or more. The absolute value may be, in another example, 0.2, 0.3, 0.4, 0.5, or 0.6 or more. In addition, the absolute value may be, in another example, 2, 1.8, 1.6, 1.4, or 1.2 or less. Each range of the first and second refractive indexes is not particularly limited as long as the range of the refractive index is ensured. However, for example, the refractive index of the first sub layer may be in a range of 1.4 to 1.9, and the refractive index of the second sub layer may be in a range of 2.0 to 2.6. The first and second sub layers may be a metal oxide layer, respectively.

More particularly, the barrier layer including the material and the shape may have a structure in which, for example, an $Al_2O_3$ layer as a first sub layer and a $TiO_2$ layer as a second sub layer are alternately stacked by repeatedly performing sequential formation of the $Al_2O_3$ layer and the $TiO_2$ layer on the base film. In addition, as the second sub layer, instead of the TiO$_2$ layer, a layer satisfying the above range of the refractive index formed of, for example, ZrO$_2$, HfO$_2$, La$_2$O$_5$, or TaO$_5$ may be formed.

The inorganic material layer or each sub layer may be formed by a known method, but to ensure the interface cohesion, it is preferable that the inorganic material layer or each sub layer is formed by atomic layer deposition (ALD). The ALD may include a process of alternately depositing a precursor such as an organic metal and a precursor such as water on an adherend surface, and in this process, monolayers of the precursors may be alternately formed. More detailed descriptions will be provided. When a predetermined functional group, for example, the above-described hydroxyl group, is included in the base film, a layer formed by the ALD may react with the functional group in the formation thereof, thereby ensuring desired interface cohesion. Unless particularly defined otherwise, the term "ALD layer" may refer to an inorganic material layer formed by the ALD.

A method of forming an inorganic material layer or a sub layer which can be applied, other than the ALD, may include physical vapor deposition (PVD) such as sputtering, pulsed laser deposition (PLD), electron beam evaporation, thermal evaporation, or laser molecular beam epitaxy (L-MBE), or a chemical vapor deposition (CVD) such as metal organic chemical vapor deposition (MOCVD), hydride vapor phase epitaxy (HVPE), initiated chemical vapor deposition (iCVD), or plasma enhanced chemical vapor deposition (PECVD). When needed, a suitable one of the above methods may be selected according to a material to be used, thereby maximizing performance of the inorganic material layer.

As described above, the substrate may include an elastic layer on, under, or in the inorganic material layer. The term "elastic layer" used herein may refer to a layer including a material having an elastic modulus of 20 to 400 GPa at 23° C. In another example, the elastic modulus of the material may be 30, 40, or 50 GPa or more. In addition, in another example, the elastic modulus may be 350, 300, 250, 200, 150, or 100 GPa or less. As the elastic layer is formed using the material having the elastic modulus in such a range, a stress which may be generated in a structure in which an inorganic material layer and an organic material layer are present together may be effectively reduced. The elastic layer may include the above-described material as a main component. Here, the expression "elastic layer includes the material as a main component" may mean that the elastic layer includes the material in 60, 70, 80, or 90% or more based on a weight.

A specific type of the material for forming the elastic layer is not particularly limited as long as it has an elastic modulus in the above-described range. Each material has an elastic modulus of its own, which is known by each material. In the present application, the elastic layer may be formed by selecting a material known to have the elastic modulus of such known materials.

For example, the elastic layer may be formed using TiO$_2$, Si$_3$N$_4$, MgO, Al$_2$O$_3$, ZnO, or ZrO$_2$. The above material is known to have an elastic modulus in the above-described range. A layer of the above material may be formed, for example, by depositing the material by a conventional deposition method.

In another example, the elastic layer may be formed using an organic material or an organic/inorganic combination material. For example, the elastic layer may be a layer including a metal chelate compound and alkylene glycol, or the combination material (reaction product). Such a layer may be formed by the same method as the above-described method of forming an inorganic material layer or a sub layer, for example, molecular layer deposition (MLD). The MLD is similar to ALD, and in the MLD, a molecular fragment including an organic or inorganic material may be deposited. As a material that can be applied to the elastic layer, for example, trialkylaluminum such as trimethylaluminum, diethyl zinc, alkylene glycol having 1 to 20, 1 to 16, 1 to 12, 1 to 8, or 1 to 4 carbon atoms, an aromatic diol compound such as hydroquinone, ethanolamine, triethanolamine, or a maleic acid anhydride may be used.

For example, the elastic layer including a material having an elastic modulus in an effective range may be formed by alternately depositing the above-described metal chelate and alkylene glycol by the MLD.

In another example, the elastic layer may be an initiated chemical vapor deposition (iCVD) layer including a polymerization unit of a compound represented by Formula 1 or 2. The term "iCVD layer" used herein refers to a layer formed by iCVD, and the iCVD will be described in detail in a method of manufacturing a substrate for an OED.

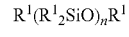

[Formula 1]

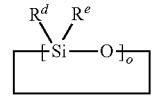

[Formula 2]

In Formula 1 or 2, $R^1$, $R^d$, and $R^e$ are each independently hydrogen, a hydroxyl group, an epoxy group, an alkoxy group, or a monovalent hydrocarbon group, at least one of $R^1$ is an alkenyl group, at least one of $R^d$ and $R^e$ is an alkenyl group, n is a number of 1 to 10, and o is a number of 3 to 10.

In Formula 1, the alkoxy group may be a linear, branched, or cyclic alkoxy group having 1 to 20, 1 to 16, 1 to 12, 1 to 8, or 1 to 4 carbon atoms.

In Formula 1, the epoxy group may be, unless particularly defined otherwise, a monovalent residue derived from a cyclic ether having three ring components or a compound including the cyclic ether. The epoxy group may be a glycidyl group, an epoxyalkyl group, a glycidoxyalkyl group, or an alicyclic epoxy group. Here, the alicyclic epoxy group may be a monovalent residue derived from a compound including an aliphatic hydrocarbon ring structure, and a structure in which two carbon atoms forming the aliphatic hydrocarbon ring also form an epoxy group. As the alicyclic epoxy group, an alicyclic epoxy group having 6 to 12 carbon atoms, for example, a 3,4-epoxycyclohexylethyl group, may be used.

As a substituent that can be optionally substituted to an epoxy group, an alkoxy group, or a monovalent hydrocarbon group, a halogen such as chlorine or fluorine, a glycidyl group, an epoxyalkyl group, a glycidoxyalkyl group, an epoxy group such as an alicyclic epoxy group, an acryloyl group, a methacryloyl group, an isocyanate group, a thiol group, or a monovalent hydrocarbon group may be used, but the present application is not limited thereto.

In addition, the term "hydrocarbon group" may refer to a monovalent residue derived from a compound composed of carbon and hydrogen or a derivative thereof. As the hydrocarbon group, an alkyl group, an alkenyl group, an alkynyl group, or an aryl group may be used.

The term "alkyl group" used herein may be, unless particularly defined otherwise, an alkyl group having 1 to 20, 1 to 16, 1 to 12, 1 to 8, or 1 to 4 carbon atoms. The alkyl group may be a linear, branched, or cyclic type. In addition, the alkyl group may be optionally substituted by at least one substituent.

The term "alkenyl group" used herein may be, unless particularly defined otherwise, an alkenyl group having 2 to 20, 2 to 16, 2 to 12, 2 to 8, or 2 to 4 carbon atoms. The alkenyl group may be a linear, branched, or cyclic type, and optionally substituted by at least one substituent.

The term "alkynyl group" used herein may be, unless particularly defined otherwise, an alkynyl group having 2 to 20, 2 to 16, 2 to 12, 2 to 8, or 2 to 4 carbon atoms. The alkynyl group may be a linear, branched, or cyclic type, and optionally substituted by at least one substituent.

The term "aryl group" used herein may be, unless particularly defined otherwise, a monovalent residue derived from a compound including a benzene ring or a structure in which at least two benzene rings are condensed or bound, or a derivative thereof. In the category of the aryl group, an aralkyl group or an arylalkyl group, in addition to a functional group conventionally referred to as an aryl group, may be included. The aryl group may have, for example, 6 to 25, 6 to 21, 6 to 18, or 6 to 12 carbon atoms. As the aryl group, a phenyl group, a dichlorophenyl group, a chlorophenyl group, a phenylethyl group, a phenylpropyl group, a benzyl group, a tolyl group, a xylyl group, or a naphthyl group may be used.

A more specific polymerization unit compound included in the iCVD layer may be, but is not limited to, for example, 1H,1H,2H,2H-perfluorodecyl (meth)acrylate, glycidyl (meth)acrylate, cyclohexyl (meth)acrylate, 2-hydroxyethyl (meth)acrylate, or a siloxane compound such as hexavinyl-disiloxane, trivinylmethylcyclosiloxane, tetravinylmethyl-cyclosiloxane, or 1,3,5-trivinyl-1,3,5,5,-pentamethyltrisi-loxane.

As one or a plurality of elastic layers are formed of the above material, a stress generated in the device may be effectively reduced.

The elastic layer may be formed of a low refractive material having a refractive index of 1.7 or less, less than 1.7, approximately 1.4 to 1.7, or approximately 1.4 to less than 1.7, or a high refractive material having a refractive index of 1.8 to 2.0. Here, when the elastic layer is formed of a low refractive layer, at least one of the inorganic material layer and the base film may have a high refractive index of 1.7 to 2.2 or 1.8 to 2.2, which may be advantageous in terms of light extraction efficiency.

A thickness of the elastic layer may be suitably determined by considering a desired effect, for example, an elastic modulus, but the present application is not particularly limited thereto. However, the thickness of the elastic layer may be approximately 100 to 500 nm. Suitable interface cohesion may be obtained in the above range, and interlayer delamination may be prevented.

The substrate of the present application may include an additional layer. For example, the substrate of the present application may further include a buffer layer between the inorganic material layer and the base film to achieve the interface cohesion between the inorganic material layer and the base film. However, the buffer layer is not an essential component, and for example, when desired interface cohesion is achieved using a substrate to which the above-described specific functional group is introduced, the buffer layer may not be required.

The substrate of the present application may also include an additional layer, such as an electrode layer present on the inorganic material layer.

As the electrode layer, a hole injection or electron injection electrode layer conventionally used in an OED may be used. The electrode layer may be a transparent electrode layer or a reflective electrode layer.

The hole injection electrode layer may be formed of, for example, a material having a relatively high work function, and when needed, formed of a transparent or reflective material. For example, the hole injection electrode layer may include a metal, alloy, or electro conductive compound having a work function of approximately 4.0 eV or more, or a mixture of at least two thereof. Such a material may be a metal such as gold, CuI, indium tin oxide (ITO), indium zinc oxide (IZO), zinc tin oxide (ZTO), an aluminum- or indium-doped zinc oxide, magnesium indium oxide, nickel tungsten oxide, an oxide material such as ZnO, $SnO_2$, or $In_2O_3$, a metal nitride such as gallium nitride, a metal selenide such as zinc selenide, or a metal sulfide such as zinc sulfide. A transparent hole injection electrode layer may also be formed using a stack structure of a metal thin film such as Au, Ag, or Cu and a high refractive transparent material such as ZnS, $TiO_2$, or ITO.

The hole injection electrode layer may be formed by an optional means such as deposition, sputtering, chemical deposition, or electrochemical means. In addition, when needed, the formed electrode layer may be patterned through known photolithography or a process using a shadow mask.

The electron injection electrode layer may be, for example, formed using a material having a relatively low work function, and may be formed using a suitable transparent or reflective material among the materials used to form the hole injection electrode layer, but the present application is not limited thereto. The electron injection electrode layer may also be formed by, for example, deposition or sputtering, or may be suitably patterned when needed.

The electrode layer may be formed to have a thickness of, for example, approximately 90 to 200, 90 to 180, or 90 to 150 nm.

Another aspect of the present application provides an OED. The OED may include the above-described substrate for an OED; and a device region having a first electrode layer, an organic material layer, and a second electrode layer, which are present on an inorganic material layer of the substrate. However, when the substrate for an OED includes the above-described electrode layer, the electrode layer may serve as the first electrode layer.

The exemplary OED may include the substrate including the base film and the inorganic material layer, a first electrode layer, an organic material layer, a second electrode layer, a second inorganic material layer, and a cover film, which are sequentially present in a top direction. The layers may be directly stacked between adjacent layers without another layer, or stacked by means of a different layer.

The term "top direction" used herein is, unless particularly defined otherwise, a direction from the first electrode layer to the second electrode layer, and the term "bottom direction" used herein refers to a direction from the second electrode layer to the first electrode layer.

Hereinafter, in the specification, for convenience of the description, in the above structure, a region including all of the factors present under the first electrode layer (excluding the first electrode layer) is called as a substrate region, a region including the first electrode layer, the second electrode layer, and all of the factors present therebetween is called as a device region, and a region including all of the factors (excluding the second electrode layer) present on the second electrode layer is called as an upper region.

The substrate region may have a haze in a range of 3 to 90, 3 to 85, 3 to 50, or 3 to 30%. Such a haze range may be advantageous to, for example, increase a light extraction efficiency. When needed, for a higher light extraction efficiency, as to be described below, another factor such as a gap between an emitting layer and the electrode layer may also be controlled. However, when a structure in which light is emitted from an organic layer to the top direction is designed, a haze of the substrate region is not necessarily included within the above-described range. To control the haze of the substrate region, the haze of the base film in the substrate region may be controlled, or a scattering layer or scattering adhesive which will be described below may be applied.

The substrate region may include an additional layer. As the layer additionally present in the substrate region, a scattering layer, a buffer layer, a carrier substrate, a barrier film, or an adhesive layer may be used.

The buffer layer may be formed to ensure interlayer cohesion or to control surface roughness of the above-described base film. When the scattering layer is formed on the base film, for example, the buffer layer may be formed thereon, or between the barrier layer and the first electrode layer, but the present application is not limited. As to be described below, when needed, a buffer layer may be formed in an upper region. In the specification, for convenience of discrimination, the buffer layer formed in the substrate region may be a first buffer layer, and the buffer layer formed in the upper region may be a second buffer layer.

The buffer layer may be formed as a high refractive layer. The term "high refractive layer" used herein may be a layer having a refractive index of approximately 1.6, 1.65, 1.7, or 1.75 or more. The upper limit of the refractive index of the high refractive layer may be, but is not particularly limited to, for example, approximately 2.5 or 2.0. Such a refractive index may be advantageous to improve, for example, light extraction efficiency.

The buffer layer may be formed of a suitable material which can efficiently form the buffer layer, and suitably ensure interlayer cohesion or a planarization degree without particular limitation. The buffer layer may be formed of, for example, a metal such as Al, an inorganic material such as SiOx, SiOxNy, SiNx, AlOx, ZnSnO, ITO, ZnO, IZO, ZnS, MgO, or SnOx, a polyimide, a caldo resin having a fluorene ring, a urethane, an epoxide, a polyester, a poly(amic acid), a polyimide, a polyethyleneimine, a polyvinylalcohol, a polyamide, a polythiol, a poly((meth)acrylate), or an organic material such as organic silicon. Here, as the organic silicon, the compound cited in the category of the inorganic layer or a polymer including the compound as a polymerization unit may be used. In another example, the buffer layer may be formed of a material prepared by blending a compound of an alkoxide or acylate of a metal such as zirconium, titanium, or cerium with a binder having a polar group such as a carboxyl group or a hydroxyl group. The compound of the alkoxide or acylate may be condensed with the polar group of the binder, and include the metal in a backbone of the binder, thereby realizing a high refractive index. As an example of the alkoxide or acylate compound, a titanium alkoxide such as tetra-n-butoxy titanium, tetraisopropoxy titanium, tetra-n-propoxy titanium, or tetraethoxy titanium, titanium acylate such as titanium stearate, a titanium chelate, a zirconium alkoxide such as tetra-n-butoxy zirconium, tetra-n-propoxy zirconium, tetraisopropoxy zirconium, or tetraethoxy zirconium, a zirconium acylate such as zirconium tributoxystearate, or a zirconium chelate may be used.

The buffer layer may be formed by selecting a suitable material from the above-described materials. When the buffer layer requires a high refractive index, a material having a high refractive index selected from the above-described materials, or a material prepared by blending a suitable material selected therefrom with high refractive particles or by introducing a high refractive material such as a Ti precursor to the above material may be used. The term "high refractive particles" used herein may be, for example, particles having a refractive index of 1.5, 2.0, 2.5, 2.6, or 2.7 or more. The upper limit of the refractive index of the high refractive particles may be, for example, selected in the range which can satisfy a desired refractive index. The high refractive particles may have an average particle diameter of, for example, approximately 1 to 100, 10 to 90, 10 to 80, 10 to 70, 10 to 60, 10 to 50, or 10 to 45 nm. The high refractive particles may be alumina, alumino silicate, titanium oxide, or zirconium oxide. As the high refractive particles, for example, particles having a refractive index of 2.5 or more, rutile-type titanium oxide may be used. The rutile-type titanium oxide may have a relatively high refractive index, compared to common particles, and therefore can be controlled to have a desired refractive index even in a relatively small ratio.

A method of forming a buffer layer may be, but is not particularly limited to, for example, a suitable one of the PVD and CVD, and particularly, iCVD. In another example, the buffer layer may be formed by preparing a coating solution by blending a metal alkoxide such as titanium alkoxide or zirconium alkoxide with a solvent such as alcohol or water, applying the coating solution, and performing various wet or dry coating methods including a sol-gel coating method of plasticizing the coated solution at a suitable temperature.

The thickness of the buffer layer is not particularly limited, and may be suitably selected in consideration of a position at which the buffer layer is formed and required functions. For example, when the buffer layer is formed on the scattering layer to ensure a planarized surface, it may have a relatively large thickness, compared to when the buffer layer is formed on the base film.

The substrate region may further include a scattering layer to ensure a suitable haze. The term "scattering layer" used herein may be all types of layers formed to scatter, refract, or diffract light incident on the scattering layer. A shape of the scattering layer realized to have the above-described function is not particularly limited.

For example, the scattering layer may be a layer including a matrix material and a scattering region. The term "scattering region" used herein may be, for example, a region which has a different refractive index from that of the matrix material or another surrounding material such as the buffer layer, and has a suitable size, thereby scattering, refracting, or diffracting incident light. The scattering region may be, for example, particles or an empty space. For example, the scattering region may be formed using particles having a refractive index which is different from and higher or lower than the surrounding materials. The refractive index of the scattering particles may have a difference between the surrounding material, for example, the matrix material and/or the buffer layer of more than 0.3 or 0.3 or more. For example, the scattering particles may have a refractive index of approximately 1.0 to 3.5 or 1.0 to 3.0. The scattering particles may have a refractive index of, for example, 1.0 to 1.6 or 1.0 to 1.3. In another example, the scattering particles may have a refractive index of approximately 2.0 to 3.5 or 2.2. to 3.0. The scattering particles may have an average particle diameter of, for example, 50, 100, 500, or 1,000 nm or more. The average particle diameter of the scattering particles may be, for example, 10,000 nm or less. The scattering region may also be formed with an empty space having the above size, which is charged with an air.

The scattering particle or region may be formed in a spherical, oval, polygonal, or amorphous shape, but the shape is not particularly limited. As the scattering particles, for example, particles including an organic material such as polystyrene or a derivative thereof, an acrylic resin or a derivative thereof, a silicon resin or a derivative thereof, or a novolac resin or a derivative thereof, or an inorganic material such as silica, alumina, titanium oxide, or zirconium oxide may be used. The scattering particles may be formed only of any one of the above materials or at least two thereof. For example, as the scattering particles, hollow particles or particles having a core/shell structure such as hollow silica may also be used. The scattering layer may further include a matrix material maintaining a scattering region such as the scattering particles. The type of the matrix material that can be used may be, but is not particularly limited to, for example, a suitable material selected from the above-described materials to be used in forming the buffer layer.

In another example, the scattering layer may be a layer having an uneven structure. The uneven structure of the scattering layer may be suitably controlled, and when needed, when the buffer layer having a suitable refractive index thereon is formed, incident light may be scattered. The scattering layer having the uneven structure may be manufactured by forming an uneven structure having a desired shape by, for example, curing a heat- or photo-curable material in contact with a mold which can transfer a desired shaped uneven structure while curing, or through an etching process after a material for forming the scattering layer is previously formed. In another method, the scattering layer may be formed by blending particles having suitable size and shape in a binder for forming the scattering layer. In this case, the particles are not necessarily particles having a scattering function, but may be particles having a scattering function.

The scattering layer may be formed by, for example, a coating method such as wet or dry coating, or a deposition method such as PVD or CVD, and alternatively may be formed by nanoimprinting or microembossing.

As another layer which can be included in the substrate region, a barrier film may be used. Compared to a rigid structure using a substrate having an excellent barrier property of the properties of the material such as a glass substrate, in a flexible structure, a base film having a relatively low barrier property may be applied, and therefore to compensate the barrier property, an additional barrier film may be present, for example, under the base film. As the barrier film, one which can ensure a suitable barrier property and transmissivity when needed may be used without particular limitation.

The barrier film may be adhered to the base film, for example, using an adhesive layer. The term "adhesive layer" used herein includes materials conventionally called as an adhesive, and layers formed using a material called as a pressure-sensitive adhesive and a material called as a pressure-sensitive adhesive/adhesive. The material for forming the adhesive layer may be, but is not particularly limited to, for example, a known pressure-sensitive adhesive/adhesive material such as an acrylic polymer, a silicon polymer, a rubber-based polymer, an ethylene vinyl acetate (EVA) polymer, or an olefin polymer such as polyisobutylene (PIB).

A suitable water-proof material may be blended with the adhesive layer. Hereinafter, the term "adhesive layer blended with the water-proof material" used herein may be an adhesive layer having a barrier property. The term "water-proof material" used herein may be used as a component which can adsorb or remove water or vapor introduced from an external environment through a physical or chemical reaction. A specific type of the water-proof material which can be blended with the adhesive layer may be, but is not particularly limited to, one or a mixture of at least two of, for example, a metal oxide, an organic metal oxide, a metal salt, and phosphorus pentoxide ($P_2O_5$). Here, a specific example of the metal oxide may be lithium oxide ($Li_2O$), sodium oxide ($Na_2O$), barium oxide (BaO), calcium oxide (CaO), or magnesium oxide (MgO), and the metal salt may be, but is not limited to, a sulfate such as lithium sulfate ($Li_2SO_4$), sodium sulfate ($Na_2SO_4$), calcium sulfate ($CaSO_4$), magnesium sulfate ($MgSO_4$), cobalt sulfate ($CoSO_4$), gallium sulfate ($Ga_2(SO_4)_3$), titanium sulfate ($Ti(SO_4)_2$), or nickel sulfate ($NiSO_4$); a metal halide such as calcium chloride ($CaCl_2$), magnesium chloride ($MgCl_2$), strontium chloride ($SrCl_2$), yttrium chloride ($YCl_3$), copper chloride ($CuCl_2$), cesium fluoride (CsF), tantalum fluoride ($TaF_5$), niobium fluoride ($NbF_5$), lithium bromide (LiBr), calcium bromide ($CaBr_2$), cesium bromide ($CeBr_3$), selenium bromide ($SeBr_4$), vanadium bromide ($VBr_3$), magnesium bromide ($MgBr_2$), barium iodide ($BaI_2$), or magnesium iodide ($MgI_2$); or a metal chlorate such as barium perchlorate ($Ba(ClO_4)_2$) or magnesium perchlorate ($Mg(C^1O_4)_2$).

Suitable scattering particles may be blended in the adhesive layer, and thus the adhesive layer may exhibit a suitable haze. When the adhesive layer exhibits a haze, light extraction efficiency may be improved. A type of the scattering particles which can be blended in the adhesive layer is not particularly limited, and a suitable type may be selected from the scattering particles included in the scattering layer in consideration of the refractive index of a resin for forming the adhesive layer.

As another layer which may be present in the substrate region, a carrier substrate which may be temporarily or permanently adhered under the base film may be used. Conventionally, as the carrier substrate, a rigid substrate such as a glass substrate may be used.

The substrate region may be formed in various structures. For example, the substrate region may have a structure in which a first inorganic layer and a base film are sequentially formed in a bottom direction, a structure in which a buffer layer and/or a scattering layer are formed between the first inorganic layer and the base film, or a structure in which a carrier film or a barrier film is adhered under the base film by an adhesive layer when needed.

An organic material layer is present between the first and second electrode layers. The organic material layer may include at least one or two emitting units. In such a structure, light generated from the emitting unit may be emitted to a transparent electrode layer through reflection by a reflective electrode layer.

When at least two emitting units are present, for suitable emission, an intermediate electrode layer or charge-generating layer may be further present between the plurality of emitting units. Accordingly, the emitting units may be divided by the intermediate electrode layer or charge-generating layer having a charge-generating characteristic.

A material constituting the emitting unit is not particularly limited. A fluorescent or phosphorescent organic material having various emission center wavelengths is known in the art, and a suitable type may be selected from such known materials, thereby forming the emitting unit. The material for the emitting unit may be, but is not limited to, an Alq-based material such as tris(4-methyl-8-quinolinolate) aluminum(III) (Alq3), 4-MAlq3, or Gaq3; a cyclopentadiene derivative such as C-545T($C_{26}H_{26}N_2O_2S$), DSA-amine, TBSA, BTP, PAP-NPA, spiro-FPA, PhTDAOXD ($Ph_3Si$), or 1,2,3,4,5-pentaphenyl-1,3-cyclopentadiene (PPCP); 4,4'-bis (2,2'-diphenylvinyl)-1,1'-biphenyl (DPVBi), distyrylbenzene, or a derivative thereof; 4-(dicyanomethylene)-2-tert-butyl-6-(1,1,7,7,-tetramethyljulolidyl-9-enyl)-4H-pyran (DCJTB), DDP, AAAP, or NPAMLI; or a phosphorescent material such as Firpic, m-Firpic, N-Firpic, $bon_2Ir(acac)$, $(C_6)_2Ir(acac)$, $bt_2Ir(acac)$, $dp_2Ir(acac)$, $bzq_2Ir(acac)$, $bo_2Ir(acac)$, $F_2Ir(bPY)$, $F_2Ir(acac)$, $op_2Ir(acac)$, $ppy_2Ir(acac)$, $tpy_2Ir(acac)$, fac-tris[2-(4,5'-difluorophenyl)pyridine-C'2,N] iridium(III) (FIrppy), or bis(2-(2'-benzo[4,5-a]thienyl) pyridinato-N,C3') iridium(acetylactonate) ($Btp_2Ir(acac)$). The emitting layer may include the above material as a host, and a host-dopant system including perylene, distyrylbiphenyl, DPT, quinacridone, rubrene, BTX, ABTX, or DCJTB as a dopant.

The emitting unit may also be formed by employing a suitable one exhibiting an emitting characteristic selected from electron accepting organic compounds or electron donating organic compounds, which will be described later.

The organic material layer may be formed in various structures further including various functional layers known in the art, as long as it includes the emitting unit. As a layer capable of being included in the organic material layer, an electron injection layer, a hole blocking layer, an electron transport layer, a hole transport layer, or a hole injection layer may be used.

The electron injection layer or electron transport layer may be formed using, for example, an electron accepting organic compound. Here, as the electron accepting organic compound, a known optional compound may be used without particular limitation. As such an organic compound, a polycyclic compound such as p-terphenyl or quaterphenyl, or a derivative thereof; a polycyclic hydrocarbon compound such as naphthalene, tetracene, pyrene, coronene, chrysene, anthracene, diphenylanthracene, naphthacene, or phenanthrene, or a derivative thereof; or a heterocyclic compound such as phenanthroline, bathophenanthroline, phenanthridine, acridine, quinoline, quinoxaline, or phenazine, or a derivative thereof may be used. In addition, fluoroceine, perylene, phthaloperylene, naphthaloperylene, perynone, phthaloperynone, naphthaloperynone, diphenylbutadiene, tetraphenylbutadiene, oxadiazole, aldazine, bisbenzoxazoline, bisstyryl, pyrazine, cyclopentadiene, oxine, aminoquinoline, imine, diphenylethylene, vinylanthracene, diaminocarbazole, pyrane, thiopyrane, polymethine, merocyanine, quinacridone, rubrene or a derivative thereof, a metal chelate complex compound disclosed in a patent publication such as Japanese Patent Laid-Open Application No. 1988-295695, Japanese Patent Laid-Open Application No. 1996-22557, Japanese Patent Laid-Open Application No. 1996-81472, Japanese Patent Laid-Open Application No. 1993-009470, or Japanese Patent Laid-Open Application No. 1993-017764, for example, a metal complex having at least one of metal chelated oxinoid compounds such as 8-quinolinolatos including tris(8-quinolinolato)aluminum, bis(8-quinolinolato)magnesium, bis[benzo(f)-8-quinolinolato]zinc, bis(2-methyl-8-quinolinolato)aluminum, tris(8-quinolinolato)indium, tris(5-methyl-8-quinolinolato)aluminum, 8-quinolinolatolithium, tris(5-chloro-8-quinolinolato)gallium, bis(5-chloro-8-quinolinolato)calcium, and derivatives thereof as a coordinator; an oxadiazole compound disclosed in a patent publication such as Japanese Patent Laid-Open Application No. 1993-202011, Japanese Patent Laid-Open Application No. 1995-179394, Japanese Patent Laid-Open Application No. 1995-278124, or Japanese Patent Laid-Open Application No. 1995-228579; a triazine compound disclosed in a patent publication such as Japanese Patent Laid-Open Application No. 1995-157473; a stilbene derivative disclosed in a patent publication such as Japanese Patent Laid-Open Application No. 1994-203963; a distyrylarylene derivative; a styryl derivative disclosed in a patent publication such as Japanese Patent Laid-Open Application No. 1994-132080 or Japanese Patent Laid-Open Application No. 1994-88072; a diolefin derivative disclosed in a patent publication such as Japanese Patent Laid-Open Application No. 1994-100857 or Japanese Patent Laid-Open Application No. 1994-207170; a fluorescent brightening agent such as a benzooxazole compound, a benzothiazole compound, or a benzoimidazole compound; a distyrylbenzene compound such as 1,4-bis(2-methylstyryl)benzene, 1,4-bis(3-methylstyryl)benzene, 1,4-bis(4-methylstyryl)benzene, distyrylbenzene, 1,4-bis(2-ethylstyryl)benzyl, 1,4-bis(3-ethylstyryl) benzene, 1,4-bis(2-methylstyryl)-2-methylbenzene, or 1,4-bis(2-methylstyryl)-2-ethylbenzene; a distyrylpyrazine compound such as 2,5-bis(4-methylstyryl)pyrazine, 2,5-bis (4-ethylstyryl)pyrazine, 2,5-bis[2-(1-naphthyl)vinyl]pyrazine, 2,5-bis(4-methoxystyryl)pyrazine, 2,5-bis[2-(4-biphenyl)vinyl]pyrazine, or 2,5-bis[2-(1-pyrenyl)vinyl]pyrazine; a dimethylidine compound such as 1,4-phenylenedimethylidine, 4,4'-phenylenedimethylidine, 2,5-xylene dimethylidine, 2,6-naphthylenedimethylidine, 1,4-biphenylenedimethylidine, 1,4-para-terephenylene dimethylidine, 9,10-anthracenediyldimethylidine, or 4,4'-(2,2-di-ti-butylphenylvinyl)biphenyl or 4,4'-(2,2-diphenylvinyl) biphenyl, or a derivative thereof; a silanamine derivative disclosed in a patent publication such as Japanese Patent Laid-Open Application No. 1994-49079 or Japanese Patent Laid-Open Application No. 1994-293778; a multifunctional styryl compound disclosed in a patent publication such as Japanese Patent Laid-Open Application No. 1994-279322 or Japanese Patent Laid-Open Application No. 1994-279323; an oxadiazole derivative disclosed in a patent publication such as Japanese Patent Laid-Open Application No. 1994-107648 or Japanese Patent Laid-Open Application No. 1994-092947; an anthracene compound disclosed in a patent publication such as Japanese Patent Laid-Open Application No. 1994-206865; an oxinate derivative disclosed in a patent publication such as Japanese Patent Laid-Open Application No. 1994-145146; a tetraphenyl butadiene compound disclosed in a patent publication such as Japanese Patent Laid-Open Application No. 1992-96990; an organic trifunctional compound disclosed in a patent publication such as Japanese Patent Laid-Open Application No. 1991-296595; a coumarin derivative disclosed in a patent publication such as Japanese Patent Laid-Open Application No. 1990-191694; a perylene derivative disclosed in a patent publication such as Japanese Patent Laid-Open Application No. 1990-196885; a naphthalene derivative disclosed in a patent publication such as Japanese Patent Laid-Open Application No. 1990-255789; a phthaloperynone derivative disclosed in a patent publication such as Japanese Patent Laid-Open Application No. 1990-289676 or Japanese Patent Laid-Open Application No. 1990-88689; or a styryl amine derivative disclosed in a patent publication such as Japanese Patent Laid-Open Application No. 1990-250292 may be used as an electron accepting organic compound included in the low refractive layer. In addition, here, the electron injection layer may be formed using, for example, a material such as LiF or CsF.

The hole blocking layer may be a layer capable of enhancing a lifespan and efficiency of the device by preventing approach of injected holes to an electron injection electrode layer through the emitting layer, and may be formed in a suitable part between the emitting layer and the electron injection electrode layer using a known material when necessary.

The hole injection layer or hole transport layer may include, for example, an electron donating organic compound. As the electron donating organic compound, N,N', N'-tetraphenyl-4,4'-diaminophenyl, N,N'-diphenyl-N,N'-di(3-methylphenyl)-4,4'-diaminobiphenyl, 2,2-bis(4-di-p-tolylaminophenyl)propane, N,N,N',N'-tetra-p-tolyl-4,4'-diaminobiphenyl, bis(4-di-p-tolylaminophenyl)phenylmethane, N,N'-diphenyl-N,N'-di(4-methoxyphenyl)-4,4'-diaminobiphenyl, N,N,N',N'-tetraphenyl-4,4'-diaminodiphenylether, 4,4'-bis(diphenylamino)quadriphenyl, 4-N,N-diphenylamino-(2-diphenylvinyl)benzene, 3-methoxy-4'-N,N-diphenylamino-styrylbenzene, N-phenylcarbazole, 1,1-bis(4-di-p-triaminophenyl)cyclohexane, 1,1-bis(4-di-p-triaminophenyl)-4-phenylcyclohexane, bis(4-dimethylamino-2-methylphenyl)phenylmethane, N,N,N-tri(p-tolyl)amine, 4-(di-p-tolylamino)-4'-[4-(di-p-tolylamino)styryl]stilbene, N,N,N',N'-tetraphenyl-4,4'-diaminobiphenyl N-phenylcarbazole, 4,4'-bis[N-(1-naphthyl)-N-phenylamino]biphenyl, 4,4''-bis[N-(1-naphthyl)-N-phenylamino]p-terphenyl, 4,4'-bis[N-(2-naphthyl)-N-phenylamino]biphenyl, 4,4'-bis[N-(3-acenaphthenyl)-N-phenylamino]biphenyl, 1,5-bis[N-(1-naphthyl)-N-phenylamino]naphthalene, 4,4'-bis[N-(9-anthryl)-N-phenylamino]biphenylphenylamino]biphenyl, 4,4''-bis[N-(1-anthryl)-N-phenylamino]-p-terphenyl, 4,4'-bis[N-(2-phenanthryl)-N-phenylamino]biphenyl, 4,4'-bis[N-(8-fluoranthenyl)-N-phenylamino]biphenyl, 4,4'-bis[N-(2-pyrenyl)-N-phenylamino]biphenyl, 4,4'-bis[N-(2-perylenyl)-N-phenylamino]biphenyl, 4,4'-bis[N-(1-coronenyl)-N-phenylamino]biphenyl, 2,6-bis(di-p-tolylamino)naphthalene, 2,6-bis[di-(1-naphthyl)amino]naphthalene, 2,6-bis[N-(1-naphthyl)-N-(2-naphthyl)amino]naphthalene, 4,4''-bis[N,N-di(2-naphthyl)amino]terphenyl, 4,4'-bis {N-phenyl-N-[4-(1-naphthyl)phenyl]amino}biphenyl, 4,4'-bis[N-phenyl-N-(2-pyrenyl)amino]biphenyl, 2,6-bis[N,N-di-(2-naphthyl)amino]fluorene, or 4,4''-bis(N,N-di-p-tolylamino)terphenyl, or an aryl amine compound such as bis(N-1-naphthyl)(N-2-naphthyl)amine may be used, but the present application is not limited thereto.

The hole injection layer or hole transport layer may be formed by dispersing an organic compound in a polymer, or using a polymer derived from the organic compound. In addition, a π-conjugated polymer such as polyparaphenylenevinylene and a derivative thereof, a hole transport non-conjugated polymer such as poly(N-vinylcarbazole), or a σ-conjugated polymer of polysilane may also be used.

The hole injection layer may be formed using an electrically-conductive polymer such as a metal phthalocyanine such as copper phthalocyanine or a non-metal phthalocyanine, a carbon film, and polyaniline, or may be formed by reaction with a Lewis acid using the aryl amine compound as an oxidizing agent.

A particular structure of the organic layer is not particularly limited. Various materials and methods for forming a hole or electron injection electrode layer and an organic layer, for example, an emitting layer, an electron injection or transport layer, or a hole injection or transport layer are known in the art, and to manufacture the OED, all of the methods may be used.

An upper region of the OED may include an inorganic material layer and a cover film, which are sequentially formed in a top direction. To discriminate the inorganic material layer from that of the substrate for an OED, the inorganic material layer included in the upper region may be referred to as a second inorganic material layer, and the inorganic material layer included in the substrate may be referred to as a first inorganic material layer.

The second inorganic material layer is present to prevent, inhibit, or reduce the permeation of external materials, thereby obtaining durability, and specific material and forming method may be similar to those described in the category of the first inorganic material layer. However, when the second inorganic material layer is designed to emit light to the substrate region, it is not necessary to form the second inorganic material layer to have a high refractive index, which is the same as that of the first inorganic material layer.

A cover film present on the second inorganic material layer may be a structure for protecting an OED, which is, for example, a known barrier film, metal sheet, or conductive film, or a stack structure of at least two thereof. The cover film in the upper region may be adhered to a top surface of the second inorganic material layer by an adhesive layer, for example, the above-described adhesive layer having a barrier property.

Still another aspect of the present application provides a use of the OED, for example, an OLED. The OLED may be effectively applied to a backlight of a liquid crystal display (LCD), lightings, sensors, a light source of a printer or copy machine, a light source for an automobile gauge, a signal light, a pilot lamp, a display device, a light source for a planar emitting device, a display, decorations, or other kinds of lights.

In one embodiment, the present application relates to a lighting device including the OLED. When the OLED is applied to the lighting device or for different uses, other components constituting the device or a method of constituting the device is not particularly limited, but all of optional materials or methods known in the related art may be employed as long as these are used in the OLED.

Yet another aspect of the present application provides a method of manufacturing the substrate for an OED.

That is, the present application may relate to a method of manufacturing a substrate for an OED, which includes forming an elastic layer having an elastic modulus of 20 to 400 GPa on, under, or in an inorganic material layer formed on a flexible base film.

A material and a structure of the inorganic material layer may include all materials and structures described in the above-described OED, and the inorganic material layer may be formed to a thickness in a range that can prevent partial crystallization of the inorganic material layer by any one of the known methods including the ALD described above for forming a monolayer or multilayer film without limitation.

That is, the inorganic material layer of the present application may be formed by applying any one or at least two of the above-described methods of forming an inorganic material layer. For example, a single inorganic material layer may be formed in a predetermined thickness range using the above-described material for forming an inorganic material layer and ALD.

In addition, the inorganic material layer may be formed in a multilayer structure, for example, by repeatedly performing a process of forming a first sub layer, and forming a second sub layer using a material different from the first sub layer and ALD. Thicknesses of the first and second sub layers may be determined in a suitable range to prevent crystallization, for example, of 7 nm or less as described above.

An example of the method of forming the inorganic material layer, that is, the principle of the ALD, may be explained by depositing a thin film formed of a solid material such as AB using gas-type materials such as AX and BY as source materials, and generating a gas-type byproduct such as XY, and a chemical reaction formula is simply shown in Reaction Formula 1.

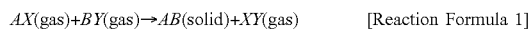

$AX(\text{gas}) + BY(\text{gas}) \rightarrow AB(\text{solid}) + XY(\text{gas})$      [Reaction Formula 1]

That is, according to the ALD, a gas-type AX material is provided to be adsorbed to a surface of a substrate, remaining AX is removed using an inert material such as an argon gas, and a gas-type BY material is provided to react with the AX adsorbed to the substrate. Afterward, a process of removing the remaining BY and the byproduct XY may be repeatedly performed.

According to the ALD, an inorganic material layer may be formed on a base film to a desired thickness, and partial crystallization of the inorganic material layer may be prevented.

Particularly, the first and second sub layers of the inorganic material layer of the present application may be formed to have a thickness of 7 nm or less using ALD. Due to such a thickness, the partial crystallization of the desired inorganic material layer may be prevented.

In addition, the first and second sub layers may be alternately formed, thereby forming an inorganic material layer having a multilayer structure.

A refractive index of the inorganic material layer with respect to a wavelength of 550 nm may be suitably selected in consideration of the above-described ranges of the refractive indexes of the first electrode layer and the base film, and as an example, the refractive index of the inorganic material layer may be 1.8 to 2.2. The range of the refractive index may be determined by the refractive index of the base film, the thickness of the sub layer, and the type of the material for forming the sub layer.

The elastic layer of the present application may be formed by any one of the known methods for forming an inorganic material layer or a sub layer, for example, MLD or iCVD.

The iCVD of the present application uses chain polymerization using free radicals, and particularly, may refer to a process of depositing a polymer thin film by performing a polymer reaction in a vapor phase by vaporizing an initiator and a monomer.

The monomer of the present application may be any one of the above-described materials for forming a substrate for an organic electronic device, which is polymerized using free radicals and deposited on a base film or inorganic material layer, thereby forming an iCVD layer, without limitation.

BRIEF DESCRIPTION OF THE DRAWINGS

The above and other objects, features, and advantages of the present application will become more apparent to those of ordinary skill in the art by describing in detail exemplary embodiments thereof with reference to the adhered drawings, in which:

FIGS. 1 to 3 show structures of exemplary substrates.

DETAILED DESCRIPTION OF EXEMPLARY EMBODIMENTS

Hereinafter, exemplary embodiments of the present application will be described in detail with reference to Examples according to the present application and Comparative Examples not according to the present application.

However, the scope of the present application is not limited to the embodiments to be disclosed below.

Example 1

A barrier layer, an $Al_2O_3$ layer, and an elastic layer, an MLD layer (a combination layer of trimethylaluminum (TMA) and ethylene glycol (EG), elastic modulus: approximately 20 to 200 GPa (23° C.)) were alternately formed on a base film, a polyimide (PI) film, by the following method. The PI film was disposed on a glass substrate as a carrier substrate. Subsequently, an MLD for forming the elastic layer and an ALD for forming the barrier layer were repeatedly performed. Here, the $Al_2O_3$ layer as the barrier layer was formed of a material having a refractive index of approximately 1.5 to 1.8 during independent deposition, and the MLD layer was formed of a material having a refractive index of approximately 1.45 to 1.7 during independent deposition. The $Al_2O_3$ layer was formed by alternately adsorbing a trimethylaluminum layer and a water ($H_2O$) layer as precursors at approximately 200° C. by the known ALD. In addition, the MLD layer was formed by alternately adsorbing trimethylaluminum and ethylene glycol as precursors at approximately 100° C. by the known MLD. A structure of the formed layer was the same as a structure formed by repeating the structure of the $Al_2O_3$ layer (thickness: 0.5 to 30 mm)/the MLD layer (thickness: 200 to 500 mm) 2.5 to 3 times.

Subsequently, a hole injection electrode layer including indium tin oxide (no) was formed on the above layer by a known sputtering method, and a hole injection layer including N,N'-Di-[(1-nalhthyl)-N,N'-diphenyl]-1,1'-biphenyl]-4,4'-diamine (α-NPD) and an emitting layer including 4,4',4'''-tris(N-carbazolyl)-triphenylamine (TCTA; Firpic, TCTA;Fire6) were sequentially formed by deposition. Subsequently, a low refractive organic layer was formed to a thickness of approximately 70 nm by co-depositing an electron transport compound, TCTA, and a low refractive material, LiF (refractive index: approximately 1.39) on the emitting layer to have a refractive index of the total layer of approximately 1.66. Subsequently, a device was manufactured by forming an aluminum (Al) electrode as an electron injection reflective electrode on the low refractive organic layer by vacuum deposition. Subsequently, an encapsulation structure was adhered to the device in a glove box in an Ar gas atmosphere, thereby manufacturing an OED.

Example 2

An OED including a substrate for an OED having an elastic modulus of 25 to 130 GPa was manufactured by forming a layer by the same method as described in Example 1, and changing cycles for performing MLD and ALD to satisfy Equation 1.

$0.2 < N_A/(N_A+N_B) < 0.8$      [Equation 1]

In Equation 1, $N_A$ is the number of ALD layers included in the substrate, and $N_B$ is the number of MLD layers included in the substrate.

Example 3

An OED was manufactured by the same method as described in Example 1, except that a substrate for an OED including a stack structure of an $Al_2O_3$ layer (thickness: 0.5 to 30 nm)/an iCVD layer (thickness: 200 to 500 nm) was formed by applying and inducing the iCVD layer (elastic modulus: approximately 4 to 8 GPa (23° C.), refractive index: approximately 1.5 to 1.6) using trivinyltrimethylcyclotrisiloxane (V3D3) as an elastic layer, instead of an MLD layer, to a surface of a PI film or a surface of the $Al_2O_3$ layer as a barrier layer. The iCVD layer was formed of the V3D3 as a monomer, and tert-butyl peroxide (TBP, 97%, Aldrich) as an initiator, and the initiator in the mixture of the monomer and the initiator was thermally decomposed with a filament maintained at approximately 250 to 300° C., and polymerization was induced on a surface of the PI film or the barrier layer ($Al_2O_3$) in which a temperature was maintained at 30 to 40° C.

Examples 4 to 7

A substrate for an OED and an OED including the substrate were manufactured by the same method as described in Example 3, except that the type of a monomer for forming an iCVD layer and stacking cycles were changed as shown in Table 1.

Comparative Example 1

A substrate and an OED were manufactured by the same method as described in Example 1, except that an MLD layer was not formed and only a barrier layer was formed to have the same thickness as the total thickness of the elastic layer and the inorganic material layer in Example 1.

Experimental Example 1

After the OEDs manufactured in Examples 1 to 7 and Comparative Example 1 were operated under the same conditions, delamination and/or generation of a crack were (was) observed at an interface between a PI film and an inorganic material layer and an interface between an inorganic material layer and an electrode layer. As a result, in the device of Comparative Example 1, delamination and a crack were observed at the interface between the PI film and the inorganic material layer and the interface between the inorganic material layer and the electrode layer, but in Examples 1 to 7, such failures were not observed.

TABLE 1

|  | Example 1 | Example 2 | Example 3 | Example 4 | Example 5 | Example 6 | Example 7 | Comparative Example 1 |
| --- | --- | --- | --- | --- | --- | --- | --- | --- |
| Inorganic material layer (material) | ALD layer ($Al_2O_3$) | ALD layer ($Al_2O_3$) | ALD layer ($Al_2O_3$) | ALD layer ($Al_2O_3$) | ALD layer ($Al_2O_3$) | ALD layer ($Al_2O_3$) | ALD layer ($Al_2O_3$) | ALD layer ($Al_2O_3$) |
| Elastic layer (material) | MLD layer (TMA and EG) | MLD layer (TMA and EG) | iCVD layer (V3D3) | iCVD layer (FDEA) | iCVD layer (GMA) | iCVD layer (HEMA) | iCVD layer (GMA) | none |
| Stacking cycles | 2.5 to 3 | — | 1 | 1 | 1 | 2 | 3 | none |

TMA: Trimethylaluminum
EG: Ethylene glycol
V3D3: Trivinyltrimethylcyclotrisiloxane
FDEA: 1H, 1H, 2H, 2H-perfluorodecyl (meth)acrylate
GMA: Glycidyl (meth)acrylate
HEMA: 2-hydroxyethyl (meth)acrylate The present application can provide a substrate for a device having excellent durability by preventing interlayer delamination occurring due to internal stress in a structure in which an organic material and an inorganic material are mixed. In addition, the present application can provide an OED having another required physical property such as excellent light extraction efficiency using the substrate, as well as the excellent durability.

While the invention has been shown and described with reference to certain exemplary embodiments thereof, it will be understood by those skilled in the related art that various changes in form and details may be made therein without departing from the scope of the invention as defined by the appended claims.

What is claimed is:

1. A substrate for an organic electronic device (OED), comprising:
   a flexible base film;
   an inorganic material layer present on the base film; and
   an elastic layer present on, under, or in the inorganic material layer, and including a material having an elastic modulus at 23° C. of 20 to 400 GPa,
   wherein the inorganic material layer includes first and second sub layers, each having a thickness of 7 nm or less, and
   wherein the first sub layer has a refractive index of 1.4 to 1.9, and the second sub layer has a refractive index of 2.0 to 2.6.

2. The substrate according to claim 1, wherein the base film has a haze of 3 to 30%.

3. The substrate according to claim 1, wherein the base film has a refractive index with respect to light having a wavelength of 550 nm of 1.7 or more.

4. The substrate according to claim 1, wherein the inorganic material layer has a thickness of 10 to 100 nm.

5. The substrate according to claim 1, wherein the inorganic material layer and the base film have a difference in refractive index of 1 or less.

6. The substrate according to claim 1, wherein the first sub layer and the second sub layer are stacked in contact with each other, and include different oxide layers, nitride layers, or oxynitride layers, respectively.

7. The substrate according to claim 1, wherein the elastic layer has a refractive index of 1.7 or less.

8. A substrate for an organic electronic device (OED), comprising:
a flexible base film;
an inorganic material layer present on the base film; and
an elastic layer present on, under, or in the inorganic material layer, and including a material having an elastic modulus at 23° C. of 20 to 400 GPa,
wherein the elastic layer includes $TiO_2$, $Si_3N_4$, MgO, $Al_2O_3$, ZnO, or $ZrO_2$.

9. A substrate for an organic electronic device (OED), comprising:
a flexible base film;
an inorganic material layer present on the base film; and
an elastic layer present on, under, or in the inorganic material layer, and including a material having an elastic modulus at 23° C. of 20 to 400 GPa,
wherein the elastic layer is a molecular layer deposition (MLD) layer including a metal or non-metal chelate compound and alkylene glycol, or the reaction product.

10. The substrate according to claim 1, wherein the elastic layer is an initiated chemical vapor deposition (iCVD) layer including a polymerization unit of a compound of Formula 1 or 2:

[Formula 1]

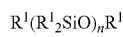

[Formula 2]

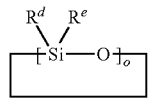

wherein $R^1$, $R^d$, and $R^e$ each independently is hydrogen, a hydroxyl group, an epoxy group, an alkoxy group, or a monovalent hydrocarbon group, at least one of $R^1$ is an alkenyl group, at least one of $R^d$ and $R^e$ is an alkenyl group, n is a number from 1 to 10, and o is a number from 3 to 10.

11. An organic electronic device (OED), comprising:
the substrate for an OED of claim 1; and
a device region having a first electrode layer, an organic material layer, and a second electrode layer, which are present on an inorganic material layer of the substrate.

12. A light source for a display, comprising:
the OED of claim 11.

13. A lighting device, comprising:
the OED of claim 11.

14. A method of manufacturing the substrate for an OED of claim 1, comprising:
forming an elastic layer on, under, or in an inorganic material layer formed on a flexible base film, wherein the inorganic material layer is formed in a stack structure of first and second sub layers, each having a thickness of 7 nm or less, using atomic layer deposition (ALD).

15. The method according to claim 14, wherein the elastic layer is formed by MLD or iCVD.

16. An organic electronic device (OED), comprising:
the substrate for an OED of claim 8; and
a device region having a first electrode layer, an organic material layer, and a second electrode layer, which are present on an inorganic material layer of the substrate.

17. A light source for a display, comprising:
the OED of claim 16.

18. A lighting device, comprising:
the OED of claim 16.

19. An organic electronic device (OED), comprising:
the substrate for an OED of claim 9; and
a device region having a first electrode layer, an organic material layer, and a second electrode layer, which are present on an inorganic material layer of the substrate.

20. A light source for a display, comprising:
the OED of claim 19.

21. A lighting device, comprising:
the OED of claim 19.

* * * * *